(12) United States Patent
Wu et al.

(10) Patent No.: US 11,368,146 B2
(45) Date of Patent: Jun. 21, 2022

(54) ANALOG DELAY CELL HAVING CONTINUOUS ADJUSTABLE DELAY TIME

(71) Applicant: UNITED MICROELECTRONICS CORP., Hsin-Chu (TW)

(72) Inventors: Kun-Yuan Wu, Kaohsiung (TW); Wei-Jen Wang, Tainan (TW); Chien-Fu Chen, Miaoli County (TW); Chen-Hsien Hsu, Hsinchu County (TW); Yuan-Hui Chen, Hsinchu (TW); Cheng-Yang Tsai, Kaohsiung (TW); Ruei-Yau Chen, Pingtung County (TW); Cheng-Tsung Ku, Taichung (TW); Zhi-Hong Huang, Tainan (TW); Yu-Lin Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 24 days.

(21) Appl. No.: 16/847,682

(22) Filed: Apr. 14, 2020

(65) Prior Publication Data
US 2021/0288634 A1 Sep. 16, 2021

(30) Foreign Application Priority Data
Mar. 11, 2020 (TW) .................... 109107960

(51) Int. Cl.
*H03K 5/13* (2014.01)
*H03K 5/00* (2006.01)

(52) U.S. Cl.
CPC ..... *H03K 5/13* (2013.01); *H03K 2005/00019* (2013.01); *H03K 2005/00195* (2013.01)

(58) Field of Classification Search
CPC .......... H03K 5/13; H03K 2005/00019; H03K 2005/000195; H03K 5/131; H03K 5/133; H03K 3/0315; H03K 2217/0018
See application file for complete search history.

(56) References Cited

U.S. PATENT DOCUMENTS

| 5,994,939 A | 11/1999 | Johnson | |
|---|---|---|---|
| 6,184,735 B1* | 2/2001 | Kobayashi | H03K 5/131 327/276 |
| 7,142,004 B2* | 11/2006 | Calrson | H03K 19/00338 326/14 |
| 7,696,799 B2 | 4/2010 | Kim | |
| 8,653,861 B2* | 2/2014 | Noguchi | H03K 5/133 327/108 |
| 2005/0046497 A1* | 3/2005 | Nakanishi | H03L 7/099 331/57 |

* cited by examiner

*Primary Examiner* — Sibin Chen
(74) *Attorney, Agent, or Firm* — Winston Hsu

(57) ABSTRACT

A delay cell includes a cascode transistor and an inverter. The cascode transistor is used to receive a control voltage to generate a bias current, and includes a source terminal, a drain terminal, and a gate terminal receiving the control voltage. The inverter is coupled to the cascode transistor and used to generate an output signal according to the bias current in response to an input signal.

6 Claims, 5 Drawing Sheets

US 11,368,146 B2

ANALOG DELAY CELL HAVING CONTINUOUS ADJUSTABLE DELAY TIME

CROSS REFERENCE TO RELATED APPLICATION

This non-provisional application claims priority of Taiwan patent application No. 109107960, filed on 11 Mar. 2020, included herein by reference in its entirety.

BACKGROUND OF THE INVENTION

1. Field of the Invention

The invention relates to electronic circuits, and in particular, to a delay cell.

2. Description of the Prior Art

A delay cell is a circuit for delaying a signal, and is widely used in a variety of electronic circuits. In the related art, a plurality of inverters are connected in series to realize the delay cell, requiring a large circuit area and a large number of selection circuits. Moreover, the delay time of the delay cell is limited to a delay time unit of the inverter.

SUMMARY OF THE INVENTION

According to one embodiment of the invention, a delay cell includes a cascode transistor and an inverter. The cascode transistor is used to receive a control voltage to generate a bias current, and includes a source terminal, a drain terminal, and a gate terminal used to receive the control voltage. The inverter is coupled to the cascode transistor and is used to generate an output signal according to the bias current in response to an input signal. The inverter includes a P-type transistor and an N-type transistor. The P-type transistor has a source terminal, a drain terminal used to generate the output signal, and a gate terminal used to receive the input signal. The N-type transistor has a drain terminal coupled to the drain terminal of the P-type transistor and used to generate the output signal, a source terminal, and a gate terminal coupled to the gate terminal of the P-type transistor and used to receive the input signal.

According to another embodiment of the invention, a delay cell includes a first cascode transistor, a second cascode transistor and an inverter. The first cascode transistor is used to receive a first control voltage to generate a first bias current, and has a gate terminal used to receive the first control voltage, a source terminal coupled to a power supply terminal, and a drain terminal used to generate the first bias current. The second cascode transistor is used to receive a second control voltage to generate a second bias current, and has a gate terminal used to receive the second control voltage, a drain terminal used to generate the second bias current, and a source terminal coupled to a ground terminal. The inverter is coupled to the first cascode transistor and the second cascode transistor, is used to generate an output signal according to the first bias current or the second bias current in response to an input signal, and includes a P-type transistor and an N-type transistor. The P-type transistor has a source terminal coupled to the drain terminal of the first cascode transistor, a drain terminal used to generate the output signal, and a gate terminal used to receive the input signal. The N-type transistor has a drain terminal coupled to the drain terminal of the P-type transistor and used to generate the output signal, a source terminal coupled to the drain terminal of the second cascode transistor, and a gate terminal coupled to the gate terminal of the P-type transistor and used to receive the input signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
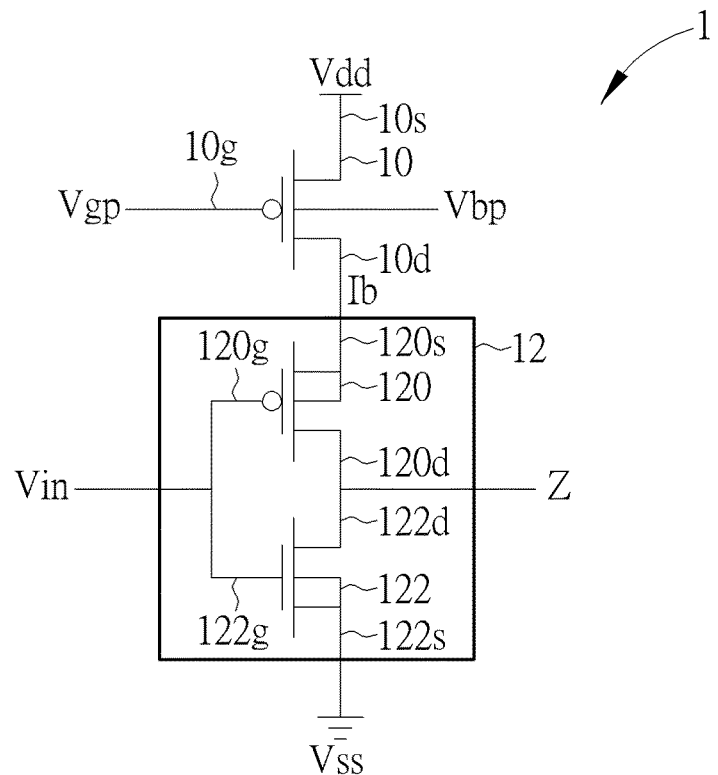
FIG. 1 is a circuit schematic of a delay cell according to an embodiment of the invention.

FIG. 1 is a circuit schematic of a delay cell 1 according to an embodiment of the invention. The delay cell 1 may delay an input signal Vin for a period of delay time to generate an output signal Z, the length of the delay time being adjustable in an analog manner. The delay cell 1 may include a cascode transistor 10 and a first inverter 12 coupled to each other. The cascode transistor 10 may receive a first control voltage Vgp and a second control voltage Vbp to generate a bias current Ib. The first inverter 12 may generate the output signal Z according to the bias current Ib in response to the input signal Vin. The length of the delay time may be controlled by the magnitude of the bias current Ib. The phase of the output signal Z and the phase of the input signal Vin may be substantially opposite to each other.

The cascode transistor 10 may be a P-type transistor, and comprise a gate terminal 10g configured to receive the first control voltage Vgp, a source terminal 10s coupled to a power supply terminal, and a drain terminal 10d coupled to the first inverter 12. The power supply terminal may provide a supply voltage Vdd, e.g., 1.8V. The cascode transistor 10 may have a threshold voltage Vtp, e.g., 0.65V. The first control voltage Vgp ranges substantially between 0V and a difference (Vdd−Vtp) between the supply voltage Vdd and the threshold voltage Vtp, as expressed in Equation 1:

$$(Vdd-Vtp) > Vgp > 0 \qquad \text{Equation 1}$$

The smaller the first control voltage Vgp is, the larger the bias current Ib generated by the cascode transistor 10 will be. The cascode transistor 10 may further comprise a body bias terminal configured to receive the second control voltage Vbp. The second control voltage Vbp ranges substantially between the supply voltage Vdd and twice the supply voltage Vdd, as expressed in Equation 2:

$$Vdd < Vbp < 2Vdd \qquad \text{Equation 2}$$

The larger the second control voltage Vbp is, the larger the bias current Ib generated by the cascode transistor 10 will be. The cascode transistor 10 may be regarded as a voltage-controlled variable resistor. The smaller the voltage difference between the gate terminal 10g to the body bias terminal of the cascode transistor 10 is, the smaller the resistance of the cascode transistor 10 will be, resulting in a larger bias current Ib.

The first inverter 12 may include a first P-type transistor 120 and a first N-type transistor 122. The first P-type transistor 120 comprises a gate terminal 120g configured to receive the input signal Vin, a source terminal 120s coupled to the drain terminal 10d of the cascode transistor 10 and configured to receive the bias current Ib, and a drain terminal 120d configured to generate the output signal Z. The first N-type transistor 122 comprises a gate terminal 122g configured to receive the input signal Vin, a drain terminal 122d coupled to the drain terminal 120d of the first P-type transistor 120 and configured to generate the output signal Z, and a source terminal 122s coupled to a ground terminal. The ground terminal may provide a ground voltage Vss, e.g., 0V. When the input signal Vin is pulled from a high level to a low level, if the bias current Ib is smaller, it may take the first P-type transistor 120 a longer delay time to pull the output signal Z from the low level to the high level; whereas if the bias current Ib is larger, it may take the first P-type transistor 120 a shorter delay time to pull the output signal Z from the low level to the high level. The high level may be the supply voltage Vdd, and the low level may be the ground voltage Vss. In this fashion, the delay cell 1 may control the delay time for the falling edge of the input signal Vin by the first control voltage Vgp and the second control voltage Vbp to generate the output signal Z.

In some embodiments, the delay cell 1 may further include a second inverter coupled to the first inverter 12 and configured to receive the output signal Z to generate a delay signal. The phase of the delay signal and the phase of the input signal Vin may be substantially identical. The second inverter may improve the waveform of the output signal Z, for example, by increasing a slew rate of the output signal Z. In some embodiments, the delay cell 1 may adjust the length of the delay time by adjusting only the first control voltage Vgp or the second control voltage Vbp.

The delay cell 1 may adjust the length of the delay time by adjusting the first control voltage Vgp or the second control voltage Vbp, reducing circuit area, and enabling the delay time adjustable to any continuous length without being limited by a fixed time delay unit.

Figure 2:
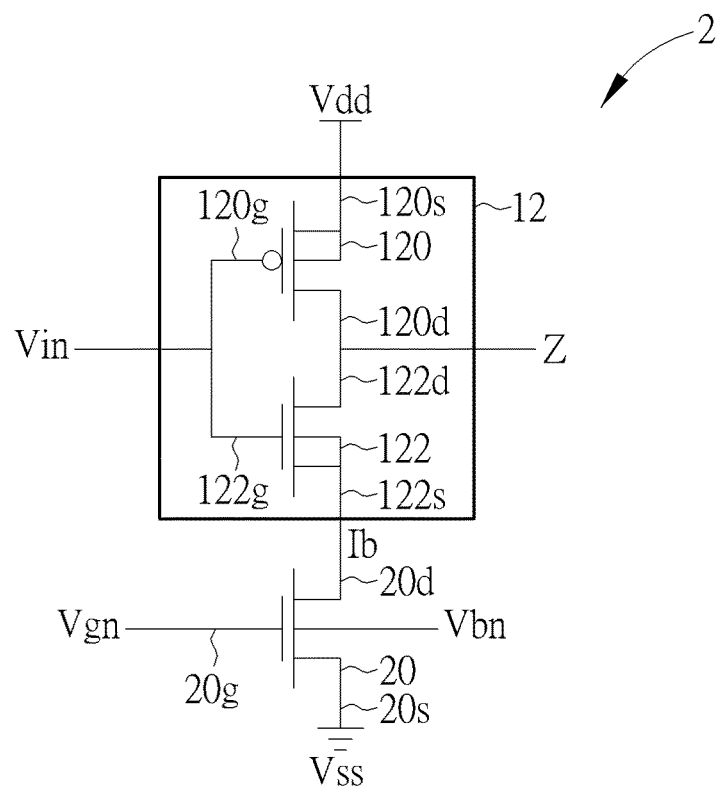
FIG. 2 is a circuit schematic of another delay cell according to an embodiment of the invention.

FIG. 2 is a circuit schematic of another delay cell 2 according to an embodiment of the invention. The delay cell 2 may delay an input signal Vin for a period of delay time to generate an output signal Z, the length of the delay time being adjustable in an analog manner. The delay cell 2 may include a first inverter 12 and a cascode transistor 20 coupled to each other. The cascode transistor 20 may receive a first control voltage Vgn and a second control voltage Vbn to generate a bias current Ib. The first inverter 12 may generate the output signal Z according to the bias current Ib in response to the input signal Vin. The length of the delay time may be controlled by the magnitude of the bias current Ib. The phase of the output signal Z and the phase of the input signal Vin may be substantially opposite to each other.

The cascode transistor 20 may be an N-type transistor, and comprise a gate terminal 20g configured to receive the first control voltage Vgn, a drain terminal 20d coupled to the first inverter 12, and a source terminal 20s coupled to a ground terminal. The ground terminal may provide a ground voltage Vss, e.g., 0V. The cascode transistor 20 may have a threshold voltage Vtn, e.g., 0.65V. The first control voltage Vgn ranges substantially between the threshold voltage Vtn and a supply voltage Vdd, as expressed in Equation 3:

$$Vtn < Vgn < Vdd \qquad \text{Equation 3}$$

The larger the first control voltage Vgn is, the larger the bias current Ib generated by the cascode transistor 20 will be. The power supply terminal may provide a supply voltage Vdd, e.g., 1.8V. The cascode transistor 20 may further comprise a body bias terminal configured to receive the second control voltage Vbn. The second control voltage Vbn ranges substantially between 0V and a negated value of the supply voltage (–Vdd), as expressed in Equation 4:

$$0 > Vbn > -Vdd \qquad \text{Equation 4}$$

The smaller the second control voltage Vbn is, the larger the bias current Ib generated by the cascode transistor 20 will be. The cascode transistor 20 may be regarded as a voltage-controlled variable resistor. The larger the voltage difference between the gate terminal 20g to the body bias terminal of the cascode transistor 20 is, the smaller the resistance of the cascode transistor 20 will be, resulting in a larger bias current Ib.

The first inverter 12 in FIG. 2 is configured in a manner similar to the first inverter 12 in FIG. 1, the difference lies in that the source terminal 120s of the first P-type transistor 120 is coupled to the power supply terminal, and the source terminal 122s of the first N-type transistor 122 is coupled to the drain terminal 20d of the cascode transistor 20. When the input signal Vin is pulled from the low level to the high level, if the bias current Ib is smaller, it may take the first N-type transistor 122 a longer delay time to pull the output signal Z from the high level to the low level; whereas if the bias current Ib is larger, it may take the first N-type transistor 122 a shorter delay time to pull the output signal Z from the high level to the low level. In this fashion, the delay cell 2 may control the delay time for the rising edge of the input signal Vin by the first control voltage Vgn and the second control voltage Vbn to generate the output signal Z.

In some embodiments, the delay cell 2 may further include a second inverter coupled to the first inverter 12 and configured to receive the output signal Z to generate a delay signal. The phase of the delay signal and the phase of the input signal Vin may be substantially identical. The second inverter may improve the waveform of the output signal Z, for example, by increasing a slew rate of the output signal Z. In some embodiments, the delay cell 2 may adjust the length of the delay time by adjusting only the first control voltage Vgn or the second control voltage Vbn.

The delay cell 2 may adjust the length of the delay time by adjusting the first control voltage Vgn or the second control voltage Vbn, reducing circuit area, and enabling the delay time adjustable to any continuous length without being limited by a fixed time delay unit.

Figure 3:
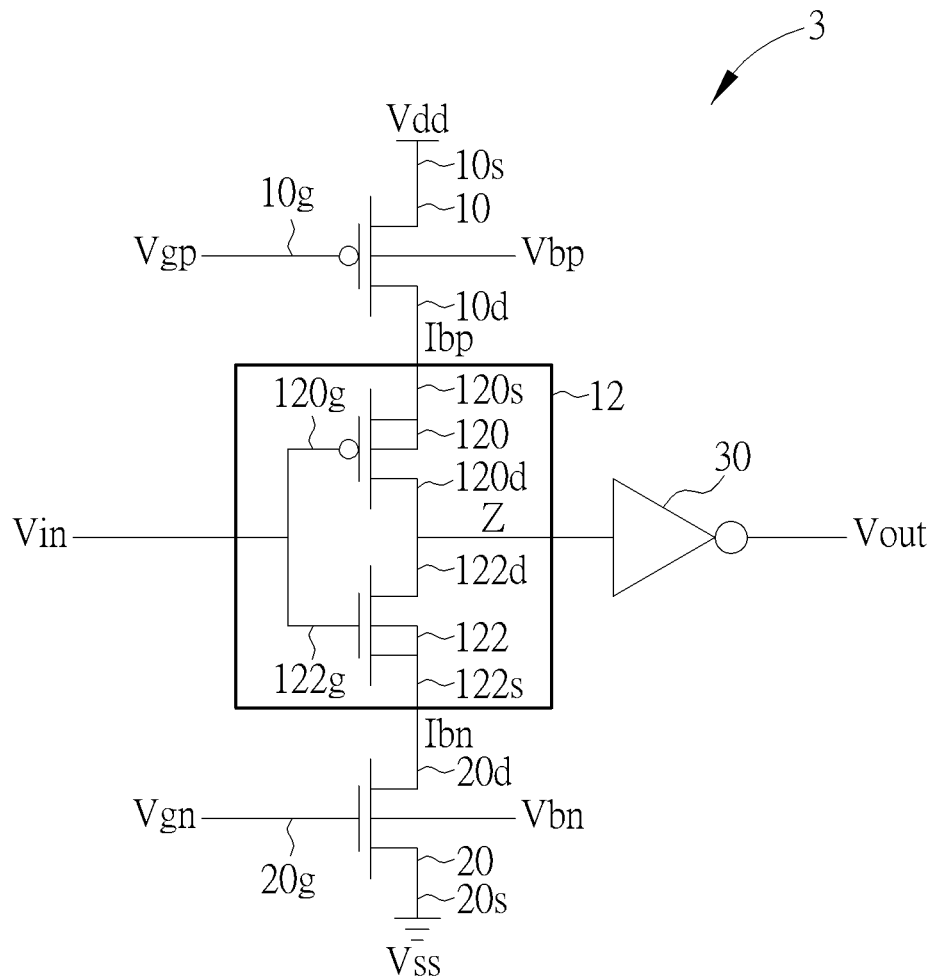
FIG. 3 is a circuit schematic of another delay cell according to an embodiment of the invention.

The delay cell 1 and the delay cell 2 may be combined to provide a delay cell 3 capable of delaying the rising edge and the falling edge of the input signal Vin. FIG. 3 is a circuit schematic of another delay cell 3 according to an embodiment of the invention. The delay cell 3 may include a first cascode transistor 10, a first inverter 12, a second cascode transistor 20 and a second inverter 30. The delay cell 3 may the delay input signal Vin for a period of delay time to generate a delay signal Vout, delay a rising edge of the input signal Vin by controlling a first control voltage Vgp and a third control voltage Vbp, and delay a falling edge of the input signal Vin by controlling a second control voltage Vgn and a fourth control voltage Vbn. The phase of the input signal Vin and the phase of the delay signal Vout may be substantially identical.

The first cascode transistor 10 is configured in a manner similar to the cascode transistor 10 in FIG. 1, the second cascode transistor 20 is configured in a manner similar to the cascode transistor 20 in FIG. 2, explanation therefor is omitted here for brevity. The first inverter 12 in FIG. 3 is configured in a manner similar to FIGS. 1 and 2, the difference lies in that the source terminal 120s of the first P-type transistor 120 is coupled to the drain terminal 10d of the first cascode transistor 10, and the source terminal 122s of the first N-type transistor 122 is coupled to the drain terminal 20d of the second cascode transistor 20. When in operation, the first cascode transistor 10 may receive the first control voltage Vgp and the third control voltage Vbp to generate the first bias current Ibp, the second cascode transistor 20 may receive the second control voltage Vgn and the fourth control voltage Vbn to generate the second bias current Ibn, the first inverter 12 may generate the output signal Z according to the first bias current Ibp or the second bias current Ibn in response to the input signal Vin, and the second inverter 30 may invert the output signal Z to generate the delay signal Vout. The ranges of the first control voltage Vgp and the third control voltage Vbp may be represented by Equations 1 and 2, respectively. The ranges of the second control voltage Vgn and the fourth control voltage Vbn may be represented by Equations 3 and 4, respectively. When the input signal Vin is pulled from the low level to the high level, the second bias current Ibn may flow from the drain terminal 122d of the first N-type transistor 122 to the ground terminal to pull the output signal Z from the high level to the low level. If the second bias current Ibn is smaller, it may take the first N-type transistor 122 a longer delay time to pull the output signal Z from the high level to the low level; whereas if the second bias current Ibn is larger, it may take the first N-type transistor 122 a shorter delay time to pull the output signal Z from the high level to the low level. When the input signal Vin is pulled from the high level to the low level, the first bias current Ibp may flow from the power supply terminal to the drain terminal 120d of the first P-type transistor 120 to pull the output signal Z from the low level to the high level. If the first bias current Ibp is smaller, it may take a longer delay time for the first P-type transistor 120 to pull the output signal Z from the low level to the high level; whereas if the first bias current Ibp is larger, it may take a shorter delay time for the first P-type transistor 120 to pull the output signal Z from the low level to the high level. In this fashion, the delay cell 1 may control the delay time for the falling edge of the input signal Vin by the first control voltage Vgp and the second control voltage Vbp to generate the output signal Z. Therefore, the delay cell 3 may control the delay times of the rising edge and falling edge of the input signal Vin, respectively, thereby providing adjustability of the delay times.

The delay cell 3 may adjust the length of the delay time by adjusting the first control voltage Vgp, the second control voltage Vgn, the third control voltage Vbp, the fourth control voltage Vbn, reducing circuit area, and enabling the delay time adjustable to any continuous length for the rising edge and falling edge of the input signal Vin without being limited by a fixed time delay unit.

The transistors in the delay cells 1, 2 and 3 may be metal-oxide-semiconductor field-effect transistors (MOSFET).

Figure 4:
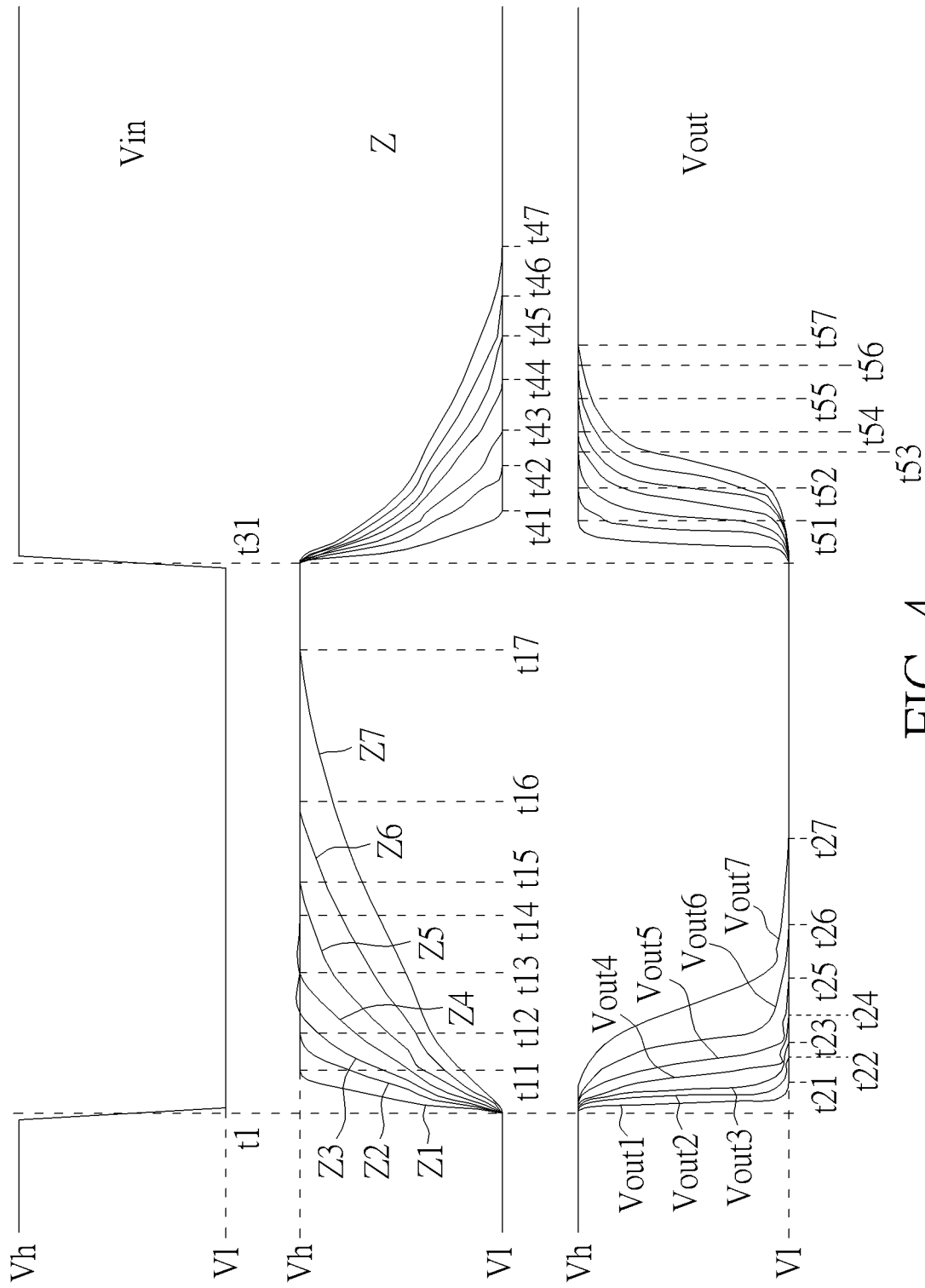
FIG. 4 shows waveforms of the delay cell in FIG. 3.

FIG. 4 shows waveforms of the delay cell 3, including the waveforms of the input signal Vin, the output signal Z and delay signal Vout. Z1 to Z7 represent output signals generated by 7 first bias currents Ibp from low to high and 7 second bias currents Ibn from high to low, respectively. Vout1 to Vout7 represent delay signals corresponding to the output signals Z1 to Z7, respectively. At Time t1, the input signal Vin is pulled from the high level Vh to the low level V1. Correspondingly, at Times t11 to t17, the output signals Z1 to Z7 are pulled from the low level V1 to the high level Vh, and at Times t21 to t27, the delay signals Vout1 to Vout7 are pulled from the high level Vh to the low level V1. Similarly, at Time t31, the input signal Vin is pulled from the low level V1 to the high level Vh. Correspondingly, at Times t41 to t47, the output signals Z1 to Z7 are pulled from the high level Vh to the low level V1, and at Times t51 to t57, the delay signals Vout1 to Vout7 are pulled from the low level V1 to the high level Vh. The delay signals Vout1 to Vout7 have higher slew rates than the output signals Z1 to Z7, respectively. Further, the delay times of the delay signals Vout1 to Vout7 are increasing with respect to the input signal Vin, respectively.

Figure 5:
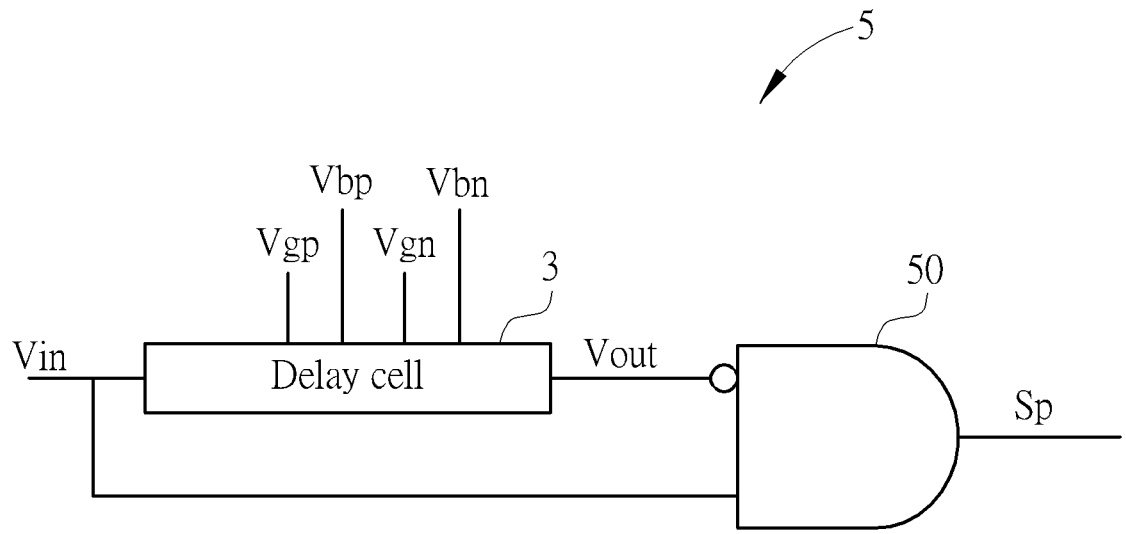
FIG. 5 is a circuit schematic of a pulse generation circuit according to an embodiment of the invention.

FIG. 5 is a circuit schematic of a pulse generation circuit 5 according to an embodiment of the invention. The pulse generation circuit 5 may generate a pulse signal Sp in response to the input signal Vin, and may adjust the pulse width of the pulse signal Sp. The pulse generation circuit 5 may include a delay cell 3 and an AND gate 50. The delay cell 3 may generate the delay signal Vout in response to the input signal Vin. The AND gate 50 may receive the input signal Vin and the delay signal Vout, and perform an AND operation on the input signal Vin and the delay signal Vout to generate the pulse signal Sp. The pulse width of the pulse signal Sp may be adjusted by adjusting the first control voltage Vgp, the second control voltage Vgn, the third control voltage Vbp and the fourth control voltage Vbn. The longer the delay time of the delay cell 3 is, the wider the pulse width of the pulse signal Sp will be.

Figure 6:
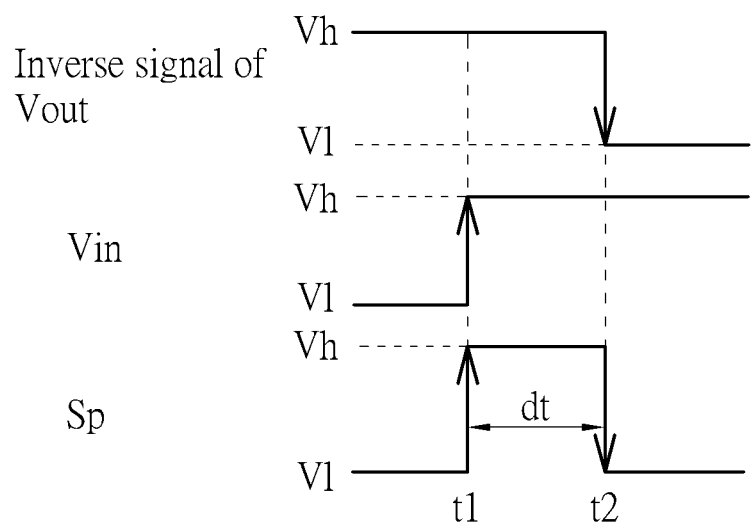
FIG. 6 is a timing diagram of the pulse generation circuit in FIG. 5.

FIG. 6 is a timing diagram of the pulse generation circuit 5 for an inverse signal of the delay signal Vout, the input signal Vin and the pulse signal Sp. At Time t1, the input signal Vin is pulled from the low level V1 to the high level Vh to generate the rising edge of the pulse signal Sp. At Time t2, the inverse signal of the delay signal Vout is pulled from the high level Vh to the low level V1 to generate the falling edge of the pulse signal Sp, thereby generating the pulse signal Sp having the pulse width dt. The pulse width dt may be a difference between Time t2 and Time t1.

While the embodiment employs the delay cell 3, it should be appreciated that the pulse generation circuit 5 may be implemented by the delay cell 1 or 2. The pulse generation circuit 5 employs a delay cell to adjust the pulse width of the pulse signal Sp by adjusting the first control voltage Vgp, the second control voltage Vgn, the third control voltage Vbp and the fourth control voltage Vbn.

Figure 7:
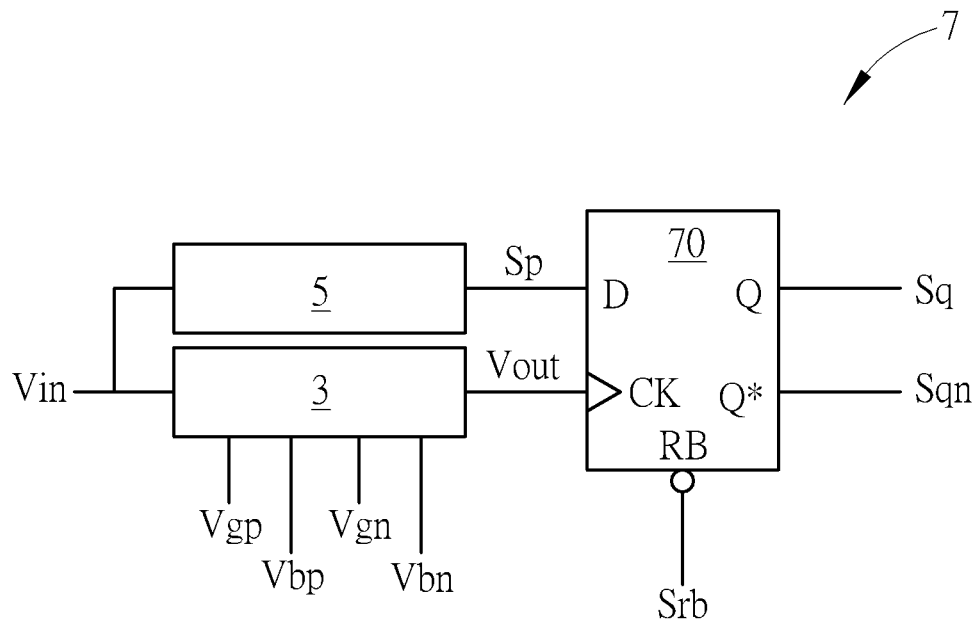
FIG. 7 is a circuit schematic of a timing measurement circuit according to an embodiment of the invention.

FIG. 7 is a circuit schematic of a timing measurement circuit 7 according to an embodiment of the invention. The timing measurement circuit 7 may include the pulse generation circuit 5, the delay cell 3 and a flip-flop 70. The pulse generation circuit 5 and the delay cell 3 may be coupled to the flip-flop 70. The timing measurement circuit 7 may be used to measure the setup time and the hold time of the flip-flop 70. The pulse generation circuit 5 may generate a pulse signal Sp in response to the input signal Vin. The delay cell 3 may generate the delay signal Vout in response to the input signal Vin. The flip-flop 70 may have a data terminal D, a clock terminal CK, a reset terminal RB, an output terminal Q and an inverted output terminal Q*. The data terminal D may receive the pulse signal Sp, the clock terminal CK may receive the delay signal Vout, the reset terminal RB may receive a reset signal Srb, the output terminal Q and the inverted output terminal Q* may generate output data Sq and inverted output data Sqn, respectively. The pulse width dt of the pulse signal Sp may exceed the delay time of the delay signal Vout. The delay cell 3 may be adjusted by adjusting the first control voltage Vgp, the second control voltage Vgn, the third control voltage Vbp and the fourth control voltage Vbn, thereby adjusting the setup time and the hold time of the flip-flop 70.

When measuring the setup time of the flip-flop 70, the delay time of the delay cell 3 may be continuously decreased until the voltage level of the pulse signal Sp may be sampled using the delay signal Vout to generate the output data Sq. An absolute difference between the starting edge of the pulse signal Sp and the rising edge of the delay signal Vout may be regarded as the setup time of the flip-flop 70. When measuring the hold time of the flip-flop 70, the delay time of the delay cell 3 may be continuously increased until the voltage level of the pulse signal Sp may be sampled using the delay signal Vout to generate the output data Sq. An absolute difference between the ending edge of the pulse signal Sp and the rising edge of the delay signal Vout may be regarded as the hold time of the flip-flop 70.

Figure 8:
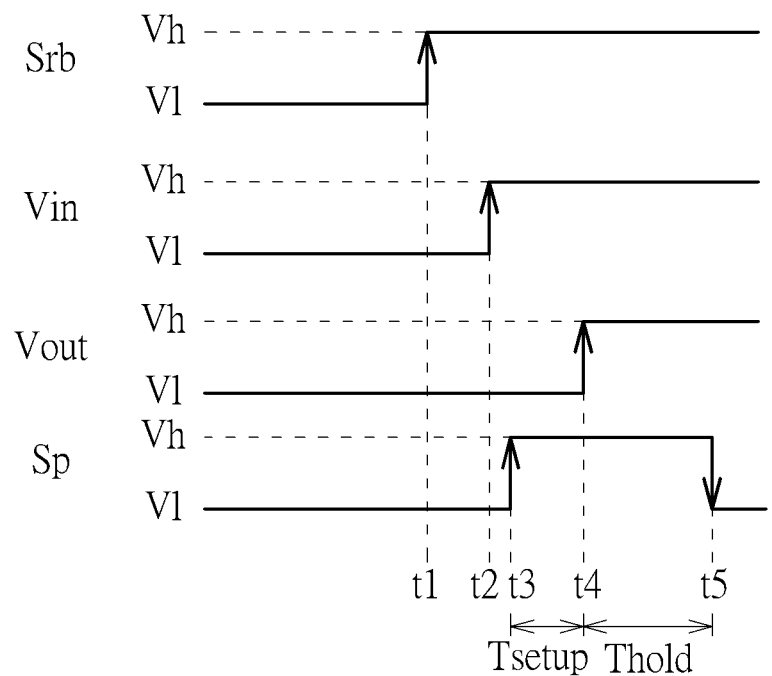
FIG. 8 is a timing diagram of the timing measurement circuit in FIG. 7.

FIG. 8 is a timing diagram of the timing measurement circuit 7 including the reset signal Srb, the input signal Vin, the delay signal Vout and the pulse signal Sp. At Time t1, the reset signal Srb is pulled from the low level V1 to the high level Vh to reset the flip-flop 70. At Time t2, the input signal Vin is pulled from the low level V1 to the high level Vh, to enable the pulse generation circuit 5 to generate the pulse signal Sp and the delay cell 3 to generate the delay signal Vout. At Time t3, the starting edge of the pulse signal Sp is a rising edge, and at Time t5, the starting edge of the pulse signal Sp is a falling edge. At Time t4, the delay signal Vout is pulled from the low level V1 to the high level Vh to latch the data of the pulse signal Sp into the flip-flop 70. Time t4 may be adjusted to measure the setup time Tsetup and the hold time Thold. When measuring the setup time Tsetup, Time t4 may be decreased until reaching a minimum Time t4 just enough for the data of the pulse signal Sp to be latched into the flip-flop 70. An absolute difference between the minimum Time t4 and Time t3 may be regarded as the setup time Tsetup of the flip-flop 70. When measuring the hold time Thold, Time t4 may be increased until reaching a maximum Time t4 just enough for the pulse signal Sp to be latched into the flip-flop 70. An absolute difference between the maximum Time t4 and Time t5 may be regarded as the hold time Thold of the flip-flop 70.

In some embodiments, the timing measurement circuit 7 may be implemented by the delay cell 1 or 2. In some embodiments, the timing measurement circuit 7 may be used to measure the setup time and the hold time of other sequential circuits. Therefore, the timing measurement circuit 7 employs a delay cell to measure the setup time and the hold time of a sequential circuit by adjusting the first control voltage Vgp, the second control voltage Vgn, the third control voltage Vbp and the fourth control voltage Vbn.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay cell comprising:
a cascode transistor configured to receive a first control voltage and a second control voltage to generate a bias current, and comprising:
  a gate terminal configured to receive the first control voltage;
  a source terminal coupled to a power supply terminal for receiving a supply voltage;
  a body bias terminal configured to receive the second control voltage; and
  a drain terminal;
a first inverter configured to generate an output signal according to the bias current in response to an input signal, and comprising:
  a first P-type transistor comprising:
    a source terminal coupled to the drain terminal of the cascode transistor;
    a drain terminal configured to generate the output signal;
    a gate terminal configured to receive the input signal; and
    a body bias terminal coupled to the source terminal of the first P-type transistor; and
  a first N-type transistor comprising:
    a drain terminal coupled to the drain terminal of the first P-type transistor and configured to generate the output signal;
    a source terminal; and
    a gate terminal coupled to the gate terminal of the first P-type transistor and configured to receive the input signal; and
a second inverter coupled to the first inverter, directly coupled to the power supply terminal and a ground terminal, and configured to receive the output signal to generate a delay signal;
wherein the second control voltage ranges substantially between the supply voltage and twice the supply voltage.

2. The delay cell of claim 1, wherein:
the cascode transistor is a P-type transistor;
the drain terminal of the cascode transistor is coupled to the source terminal of the first P-type transistor; and
the first control voltage ranges substantially between 0 V and a difference between the supply voltage and a threshold voltage of the P-type transistor.

3. A delay cell comprising:
a first cascode transistor configured to receive a first control voltage and a third control voltage to generate a first bias current, and comprising:
  a gate terminal configured to receive the first control voltage;
  a source terminal coupled to a power supply terminal for receiving a supply voltage;
  a body bias terminal configured to receive the third control voltage; and
  a drain terminal configured to generate the first bias current;
a second cascode transistor configured to receive a second control voltage and a fourth control voltage to generate a second bias current, and comprising:
  a gate terminal configured to receive the second control voltage;
  a drain terminal configured to generate the second bias current;
  a body bias terminal configured to receive the fourth control voltage; and a source terminal coupled to a ground terminal for receiving 0 V;
a first inverter configured to generate an output signal according to the first bias current or the second bias current in response to an input signal, and comprising:
 a first P-type transistor comprising:
  a source terminal coupled to the drain terminal of the first cascode transistor;
  a drain terminal configured to generate the output signal;
  a gate terminal configured to receive the input signal; and
  a body bias terminal coupled to the source terminal of the first P-type transistor; and
 a first N-type transistor comprising:
  a drain terminal coupled to the drain terminal of the first P-type transistor and configured to generate the output signal;
  a source terminal coupled to the drain terminal of the second cascode transistor;
  a gate terminal coupled to the gate terminal of the first P-type transistor and configured to receive the input signal; and
  a body bias terminal coupled to the source terminal of the first N-type transistor; and
a second inverter coupled to the first inverter, directly coupled to the power supply terminal and the ground terminal, and configured to receive the output signal to generate a delay signal;
wherein the third control voltage ranges substantially between the supply voltage and twice the supply voltage; and
the fourth control voltage ranges substantially between 0 V and a negative value of the supply voltage.

4. The delay cell of claim 3, wherein:
the first control voltage ranges substantially between 0 V and a difference between a supply voltage and a threshold voltage of the first cascode transistor; and
the second control voltage ranges substantially between a threshold voltage of the second cascode transistor and the supply voltage.

5. A delay cell comprising:
a cascode transistor configured to receive a first control voltage and a second control voltage to generate a bias current, and comprising:
 a gate terminal configured to receive the first control voltage;
 a source terminal coupled to a ground terminal for receiving 0 V;
 a body bias terminal configured to receive the second control voltage; and
 a drain terminal;
a first inverter configured to generate an output signal according to the bias current in response to an input signal, and comprising:
 a first P-type transistor comprising:
  a source terminal;
  a drain terminal configured to generate the output signal; and
  a gate terminal configured to receive the input signal; and
 a first N-type transistor comprising:
  a drain terminal coupled to the drain terminal of the first P-type transistor and configured to generate the output signal;
  a source terminal coupled to the drain terminal of the cascode transistor;
  a gate terminal coupled to the gate terminal of the first P-type transistor and configured to receive the input signal; and
  a body bias terminal coupled to the source terminal of the first N-type transistor; and
a second inverter coupled to the first inverter, directly coupled to a power supply terminal and the ground terminal, and configured to receive the output signal to generate a delay signal;
wherein the second control voltage ranges substantially between 0 V and a negative value of a supply voltage.

6. The delay cell of claim 5, wherein:
the cascode transistor is an N-type transistor;
the drain terminal of the cascode transistor is coupled to the source terminal of the first N-type transistor; and
the first control voltage ranges substantially between a threshold voltage of the N-type transistor and the supply voltage.

* * * * *